(12) United States Patent
Chuang et al.

(10) Patent No.: US 6,816,824 B2
(45) Date of Patent: *Nov. 9, 2004

(54) METHOD FOR STATICALLY TIMING SOI DEVICES AND CIRCUITS

(75) Inventors: Ching-Te K. Chuang, South Salem, NY (US); Brian W. Curran, Saugerties, NY (US); George E. Smith, III, Wappingers Falls, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/294,178

(22) Filed: Apr. 19, 1999

(65) Prior Publication Data

US 2003/0078763 A1 Apr. 24, 2003

(51) Int. Cl.$^7$ .............................. G06F 17/50; G06G 7/48
(52) U.S. Cl. ............................... 703/14; 703/4; 703/20; 703/2; 703/13; 716/6
(58) Field of Search ............................... 703/2, 13, 14, 703/20, 4; 716/6

(56) References Cited

U.S. PATENT DOCUMENTS

| | | | | |
|---|---|---|---|---|
| 5,384,720 A | * | 1/1995 | Ku et al. ..................... 364/578 |
| 5,396,615 A | * | 3/1995 | Tani ............................ 395/500 |
| 5,424,964 A | | 6/1995 | Machala, III et al. ....... 364/578 |
| 5,446,676 A | | 8/1995 | Huang et al. ................ 364/578 |
| 5,553,008 A | | 9/1996 | Huang et al. ................ 364/578 |
| 5,600,578 A | | 2/1997 | Fang et al. .................. 364/578 |
| 5,606,518 A | | 2/1997 | Fang et al. .................. 364/578 |
| 5,617,325 A | | 4/1997 | Schaefer ...................... 364/488 |
| 5,770,881 A | * | 6/1998 | Pelella et al. ................ 257/347 |
| 5,774,367 A | | 6/1998 | Reyes et al. ................. 364/448 |
| 5,796,624 A | | 8/1998 | Sridhar et al. .............. 364/489 |
| 5,972,758 A | * | 10/1999 | Liang ........................... 438/294 |
| 6,020,222 A | * | 2/2000 | Wollesen ...................... 438/149 |
| 6,023,577 A | * | 2/2000 | Smith et al. ............ 395/500.35 |
| 6,141,632 A | * | 10/2000 | Smith et al. .................. 703/14 |
| 6,429,684 B1 | | 8/2002 | Houston ....................... 326/83 |

OTHER PUBLICATIONS

Hui et al.; "Body self bias in fully depleted and non–fully depleted SOI devices"; IEEE SOI 1994 Conf.; pp. 65–66; Oct. 1994.*

Perron et al.; "Switching charateristics and static parameter extraction in PD SOI MOSFETs"; MIEL '97; pp. 293–296; Sep. 1997.*

Rios et al.; "Requirements for accurate MOS–SOI device simulations"; IEEE Tran. Elect. Dev.; pp. 581–586; Mar. 1992.*

Sinitsky et al.; "A dynamic depletion SOI MOSFET model for spice"; pp. 114–115 and 7 enlargements of figures; IEEE 1998 Symp. VLSI Tech.; Jun. 1998.*

(List continued on next page.)

Primary Examiner—Hugh Jones
(74) Attorney, Agent, or Firm—Lynn Augspurger; Cantor Colburn LLP (57) ABSTRACT

Low-conductance and high-conductance IV characteristics (models) are created using the low and high end of their body voltage ranges, respectively. The body voltage of the device (FET) is initialized to the low end of range at time zero, and then a transient, two dimensional sweep of gate and drain voltages is performed. Drain currents are measured in this two dimensional region and are used to create a piecewise, linear IV model of device. The process is repeated for the highest body voltage. This process differs significantly from prior art bulk device characterization techniques, which did not have to initialize body voltage or perform a transient analysis. The body voltage is modulating during the switching event due to the gate-to-body and diffusion-to-body coupling; and thus only a transient analysis can properly model these coupling effects.

9 Claims, 5 Drawing Sheets

OTHER PUBLICATIONS

Gautier et al.; "On the transient operation of partially depleted SOI NMOSFET's"; IEEE Elect. Dev. Lett.; pp. 497–499; Nov. 1995.*

Assaderraghi et al.; "A 7.9/5.5 psec room/low temperature SOI CMOS"; IEEE 1997 Elect. Dev. Meeting; pp. 415–418; Dec. 1997.*

Wei, A. and Antoniadis, D.A.; "Bounding the Severity of Hysteretic Transient Effects in Partially–Depleted SOI CMOS;" Proceedings 1996 IEEE International SOI Conference, Oct. 1996; pp. 74–75.

J. S. T. Huange, Jeffrey S. Kueng, and Terry Fabian; "An Analytical Model for Snapback in n–Channel SOI MOSFET's;" IEE Transactions on Electron Devices, vol. 38, No. 9, Sep. 1991; pp. 2082–2091.

Andy Wei, Melanie J. Sherony and Dimitri A. Antoniadis; "Effect of Floating–Body Charge on SOI MOSFET Design;" IEEE Transactions on Electron Devices, vol. 45, No. 2, Feb. 1998; pp. 430–438.

Srinath Krishnan and Jerry G. Fossum; "Grasping SOI Floating–Body Effects: A Good Understanding Can Lead to Reliable and Superior SOI Circuits for Low–Voltage ULSI Applications;" Circuits and Devices; Jul. 1998; pp. 32–37.

Denis Flandre; "Analysis of Floating Substrate Effects on the Intrinisic Gate Capacitance of SOI MOSFET's Using Two–Dimensional Device Simulation;" IEEE Transactions on Electron Devices, vol. 40, No. 10, Oct. 1993; pp. 1789–1796.

Denis Flandre and Sorin Cristoloveanu; "Latch and Hot–Electron Gate Current in Accumulation–Mode SOI p–MOSFET's;" IEEE Electron Device Letter, vol. 15, No. 5, May 1994.

V. Ramgopal Rao, Franz Wittmann, Harald Gossner, and Ignaz Eisele; "Hysteresis Behavior in 85–nm Channel Length Vertical n–MOSFET's Grown by MBE;" IEEE Transactions on Electron Devices, vol. 43, No. 6, Jun. 1996; pp. 973–976.

Robert Tu, Dennis Sinitsky, Fari Assaderaghi, Clement Wann, and Chenming Hu; "Simulation of Floating Body Effects in SOI Circuits using BSIM3SOI;" VSI Technology, Systems, and Applications, 1997; pp. 339–342.

V. Ferlet–cavrois, S. quoizola, O. Musseau, O. Flament, J.L. Leray, J. L. Pelloie, C. Raynaud, and O. Faynot; "Total Dose Induced Latch in Short Channel NMOS/SOI Transistors;" IEEE Transactions on Nuclear Science, vol. 45, No. 6, Dec. 1998; pp. 2458–2466.

Chandramouli Visweswarlah, Ronald A. Rohrer; Piecewise Approximate Circuit Simulation, IEEE 1989; pp. 248–251.

R. A. Schiebel, T. W. Houston, R. Rajgopal, K. Joyner, J. G. Fossum, D. Suh, and S. Krishnan; "A Study of Floating–Body Effects on Inverter Chain Delay;" Proceedings 1995 IEEE International SOI Conference, Oct. 1995; pp. 125–126.

T. W. Houston and S. Unaikrishnan; "A Guide to Simuation of Hysteretic Gate Delays Based on Physical Understanding;" Proceedings 1998 IEEE International SOI Conference, Oct. 1998; pp. 121–122.

* cited by examiner

METHOD FOR STATICALLY TIMING SOI DEVICES AND CIRCUITS

FIELD OF THE INVENTION

This invention relates to an improved method for statically timing circuits comprised of devices fabricated in silicon on insulator (SOI), and more particularly to a method that takes into account the topology of the circuit in which the device is a part. The improved method includes the determination of body voltage ranges of the SOI device, the generation of IV transient models for the device based on low end and high end body voltages, and classifying the devices based on output pull-up and cross over current in order to select IV characteristics of the devices as inputs for estimating path delays through a series of gates composed of SOI devices.

Trademarks: S/390 and IBM are registered trademarks of International Business Machines Corporation, Armonk, N.Y., U.S.A. and Lotus is a registered trademark of its subsidiary Lotus Development Corporation, an independent subsidiary of International Business Machines Corporation, Armonk, N.Y. Other names may be registered trademarks or product names of International Business Machines Corporation or other companies.

BACKGROUND

Semiconductor FET devices fabricated with bulk silicon CMOS technologies have a single, stable threshold and IV characteristic (i.e. drain current versus gate voltage and drain current versus drain voltage) because the body of such a device is tied to the substrate. Prior art computer programs for statically timing circuits comprised of FET devices fabricated in bulk silicon CMOS use, as inputs, this single, stable IV characteristic in determining the switching speed of the device. In partially-depleted SOI technologies the body is left floating and thus the body potential or voltage varies as the terminals of the device switch and as the body is charged and discharged.

As will be appreciated by those skilled in the art, partially-depleted silicon-on-insulator devices offer significant speed advantages over bulk devices. Maximum device performance is obtained when the body of a device is allowed to float. In a floating-body configuration, the body voltage is determined by the previous switching history of the device.

As the device terminals (gate, drain, and source) switch they capacitively couple to the body and cause its potential to move in the same direction as the terminal. The body potential is increased by the impact ionization as current flows between the drain and source of a device, and the body potential is decreased by various junction leakage mechanisms. The changing body potential modifies both the threshold voltage of the device and the device IV characteristics. It is difficult to establish the body potentials of the devices in a general circuit since the potentials are constantly changing due to the above effects and the switching histories of the devices are not known.

Path delay estimation is based on static timing analysis and is an important process by which one:
- identifies any circuit races/hazards which could cause a chip to malfunction.
- verifies the operational speed of a chip.
- identifies the paths which limit the operational speed.

Race identification and operational speed verification are generally called early and late mode timing, respectively.

The delay through an SOI gate (gate built from SOI devices) is thus difficult to estimate as it depends upon the so-called "strength" of the individual devices.

SUMMARY OF THE INVENTION

In one aspect, the present invention provides for a method for generating multiple model abstractions of an SOI device. In an exemplary embodiment, the method includes initializing a source, a drain and a gate terminal of the SOI device to one of a ground potential and a $V_{dd}$ potential. A body terminal of the SOI device is initialized to one of a predetermined minimum and a predetermined maximum value of a predetermined voltage range of the body of the SOI device, and the drain current is measured during the application of various drain and gate terminal voltages to the SOI device.

In another aspect, a method for generating a cold model abstraction of an SOI NFET device includes initializing a source, a drain and a gate terminal of the SOI NFET device to ground potential. A body terminal of the SOI NFET device is initialized to a predetermined minimum value of a predetermined voltage range of the body of the SOI NFET device, and the drain current is measured during the application of various drain and gate terminal voltages to the SOI NFET device.

In another aspect, a method for generating a hot model abstraction of an SOI NFET device includes initializing a source, a drain and a gate terminal of the SOI NFET to ground potential. A body terminal of the SOI NFET device is initialized to a predetermined maximum value of a predetermined voltage range of the body of the SOI NFET device, and the drain current is measured during the application of various drain and gate terminal voltages to the SOI NFET device.

In still another aspect, a method for generating a cold model abstraction of an SOI PFET device includes initializing a source, a drain and a gate terminal of the SOI PFET device to a $V_{dd}$ potential. A body terminal of the SOI PFET device is initialized to a predetermined maximum value of a predetermined voltage range of the body of the SOI PFET device, and to drain current is measured during the application of various drain and gate terminal voltages to the SOI PFET device.

In still another aspect, a method for generating a cold model abstraction of an SOI PFET device includes initializing a source, a drain and a gate terminal of the SOI PFET device to a $V_{dd}$ potential. A body terminal of the SOI PFET device is initialized to a predetermined maximum value of a predetermined voltage range of the body of the SOI PFET device, and the drain current is measured during the application of various drain and gate terminal voltages to the SOI PFET device.

DESCRIPTION OF THE DRAWINGS

The foregoing and other objects, aspects and advantages will be better understood from the following detailed description of a preferred embodiment of the invention, in which.

DETAILED DESCRIPTION OF THE INVENTION

Figure 1:
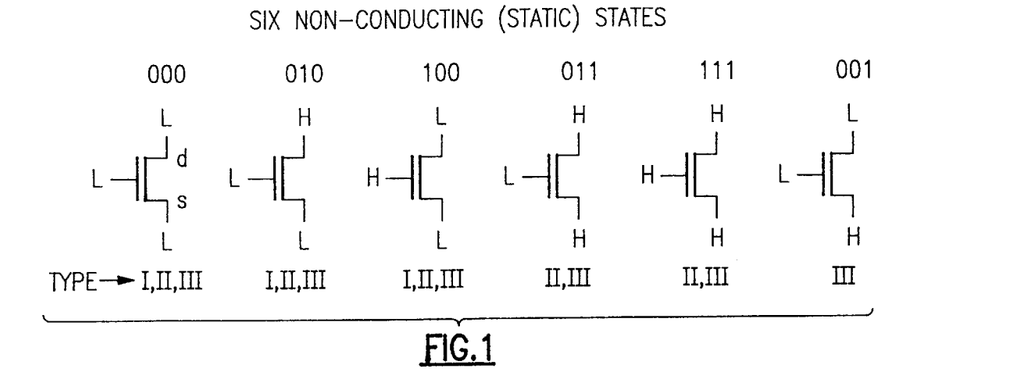
FIG. 1 illustrates the relative drain, source, and gate potentials for the six, static, non-conducting states of an FET.

Referring now to FIG. 1, it shows the source, drain, and gate logic levels for the six non-conducting or static states that an NFET device can assume. Similar states exist for PFET devices where the designation Low is replaced by High in the drawing and vice versa. It will be appreciated that in actual application, digital logic devices spend a majority of their time in a non-conducting state. In the drawing, each such non-conducting state is labeled with the logic level (1 indicates high and 0 indicates low) of the gate, drain, and source in that order. In general, it is possible for a device to spend an infinitely long time in any of these six non-conducting states and each non-conducting state can result in a different body voltage and resultant different IV characteristic.

Due to the various different effects of gate-to-body, drain-to-body, and source-to-body of the six non-conducting states on the body potential of a floating body SOI device, in accordance with the teachings of this invention, the body voltage for each of the six non-conducting states is determined. To determine a body voltage for each state, the body voltage of the device relative to ground is measured with the source, drain and gate voltages at ground potential.

Specifically, the first step is to obtain a stable, d.c. steady state solution for the device body voltage for each particular non-conducting state of the FET device. This can be accomplished by allowing the device to sit for a sufficient length of time (e.g., one second) with the logic levels set for the particular state. If any of the source, drain and gate voltages are not at ground potential when the d.c. steady state body voltage is reached, they are respectively quickly dropped to ground potential (coupling the body voltage down), and grounded-terminal body voltage is measured for the particular initial non-conducting static state. This static, grounded-terminal body voltage (Vb000), is the body voltage after the gate, source and drain voltages are coupled to ground potential after the body voltage has reached a stable state in the one of the six non-conducting states being evaluated. This static, grounded-terminal body voltage is potentially one reference value in establishing the body voltage range for the device. For each static state, the static grounded-terminal body voltage is noted as a potential maximum or minimum body voltage for the device.

Figure 2:
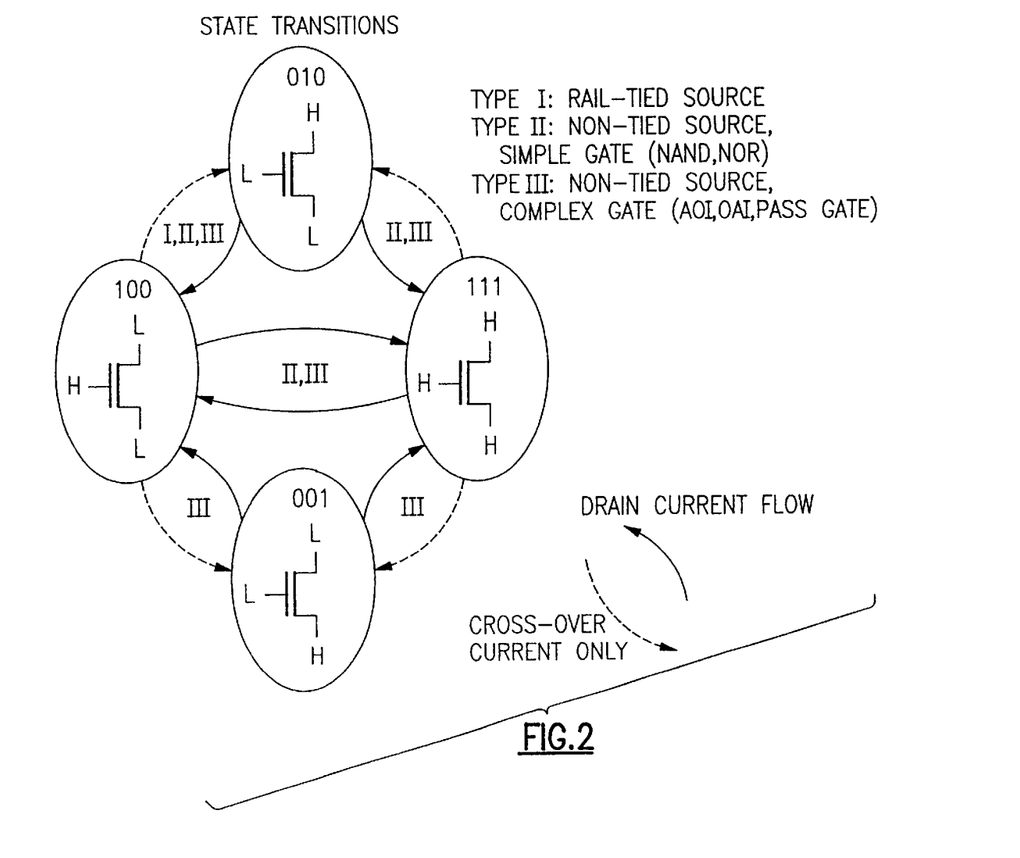
FIG. 2 is a state diagram illustrating the possible transitions among the non-conducting states that cause drain current to flow in the device.

Referring now to FIG. 2, it is likely that a device in actual operation has recently (in the last few thousand cycles, or a microsecond or so of time) been switching between two or more of these six non-conducting states. This results in steady-state body voltages different from the static state voltages due to the impact ionization current during transient switching and due to the varying leakage currents in different non-conducting states. The five state transitions which cause drain current to flow are illustrated in FIG. 2. Devices with sources tied to a supply rail (Type I devices) can only transition between states 100 and 010. Non-source tied devices in simple NAND and NOR gates (Type II devices) can additionally transition between states 010 and 111, and between states 100 and 111. All other devices are classified as Type III and can additionally transition between states 001 and 100, and between states 001 and 111.

Figure 3:
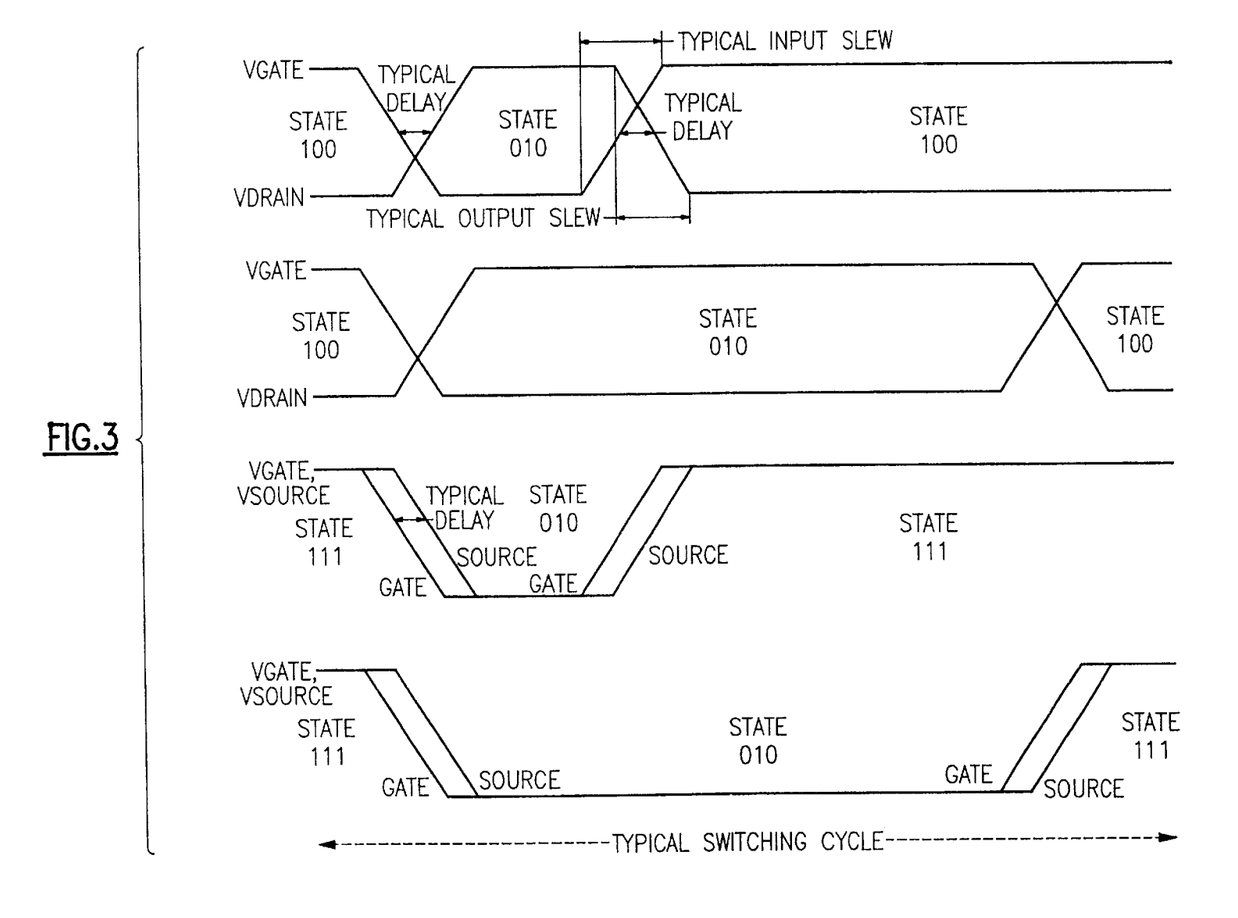
FIG. 3 is a timing diagram of four transition simulations among the non-conducting states over a typical switching cycle used for determining transient state SOI, a body potential.
Figure 4:
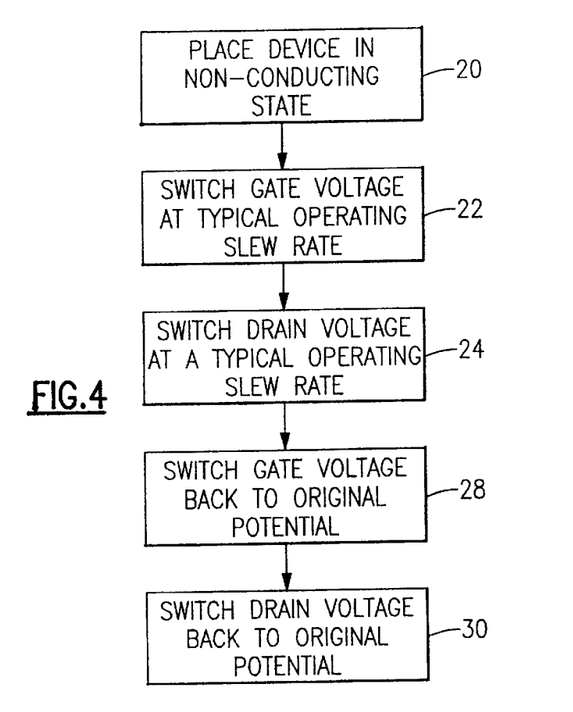
FIG. 4 is a flow diagram of one embodiment of the process for determining transient state SOI, FET body potential.

Referring now to the timing diagram of FIG. 3 and the flow diagram of FIG. 4, the process in determining transition body voltages:

starts with device in a non-conducting state, block 20;

switches the gate voltage at some input slew rate typical of the slew rate which will be used in actual operation, block 22;

next switches the drain voltage after a typical delay at a typical output slew rate, block 24;

remains in the second non-conducting state for a period of time (determined by duty cycle);

switches the gate voltage back to the original potential at a typical input slew rate, block 28;

then switches the drain voltage back to original potential at typical output slew rate, block 30.

The transient steady-state equilibrium body voltage is established using this switching cycle. The equilibrium voltage can be established by simulating thousands of such cycles until an equilibrium body voltage is established, or by initializing the body potential at the beginning of the simulation and monitoring the net increase or decrease in charge injected into the body of the device over the switching cycle. In the latter case, the desired goal is to make the net body charge contributed by impact ionization, junction leakage, and other "DC" charge contributions zero over a switching cycle.

After the equilibrium is reached, the transient grounded-terminal body voltage is obtained by:

initializing body voltage to steady state transient value;

if not already at ground, coupling source, drain and gate voltages quickly to ground (couples body voltage down);

measuring grounded-terminal body voltage.

The above-described process is repeated for each of the ten transient states to obtain a grounded terminal, transient voltage for each transient state.

state 010<-->state 111 with 10/90 duty cycle (10% of time in state 010, 90% in state 111)

state 010<-->state 111 with 90/10 duty cycle state 001<-->state 111 with 10/90 duty cycle state 001<-->state 111 with 90/10 duty cycle state 100<-->state 111 with 10/90 duty cycle state 100<-->state 111 with 90/10 duty cycle state 001<-->state 100 with 10/90 duty cycle state 001<-->state 100 with 90/10 duty cycle state 010<-->state 100 with 10/90 duty cycle state 010<-->state 100 with 90/10 duty cycle.

A grounded-terminal body voltage for each possible static state and each possible transient state is thus obtained via the above procedures. The minimum and maximum body voltages (either static body voltage or transient body voltage) establish the body voltage range for the device over all possible switching histories. These minimum and maximum values are important since they are required to properly characterize the 'best' case and 'worst' case behavior of the device. For example best (worst) case NFET device performance occurs at maximum (minimum) body voltage. Maximum NFET device body potential results in lowest device threshold voltage and highest drain currents. Similarly, best (worst) case PFET device performance occurs at minimum (maximum) body voltage.

Figure 5:
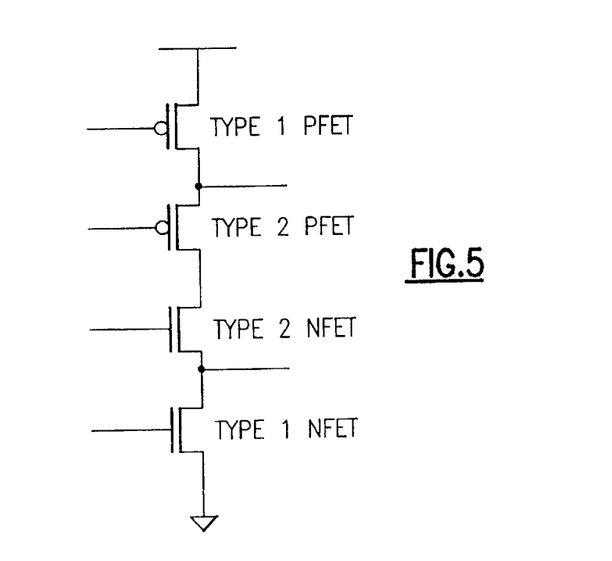
FIG. 5 is a schematic diagram illustrating devices with their source tied to a power rail (Type I) and devices with their sources not tied to a power rail (Type II).

Referring now to FIG. 5, generating multiple device model abstractions for gate and path delay estimation for SOI devices must account for the floating body effect. Since traditional bulk device bodies are tied to a known potential, the gate and path delay estimations do not account for the floating body effect. It will be appreciated that the body potential range of an SOI device is strongly influenced by the voltage ranges that are applied in actual operation to the terminals of the device. Thus, in examining digital circuits it is important here to distinguish between devices whose sources are tied to a power supply rail designated Type I in FIG. 5 and devices whose sources are not tied to a supply rail designated Type II.

Figure 6:
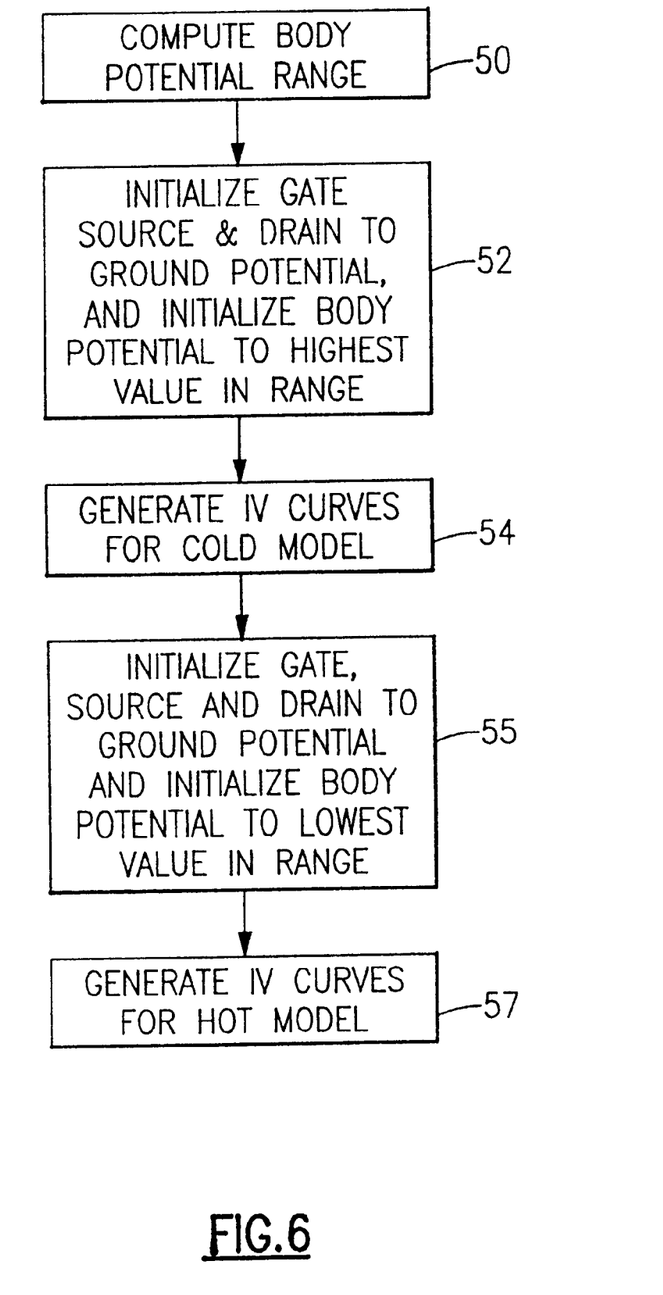
FIG. 6 is a flow diagram illustrating the method for generating SOI device IV curves.

Referring now to FIG. 6 in addition to FIG. 5, in accordance with this invention, first the body potential range for a Type I device is computed over all possible switching histories as previously described herein, block 50.

Then, we initialize the device's gate, source and drain terminals to ground potential, and initialize the body terminal to the maximum voltage of this body potential range, block 52. Third, we generate IV curves, (block 54) for the cold model via a transient circuit simulation, which:

quickly raises gate voltage to a value Vgs.

ramps drain voltage, Vds, from ground to supply voltage, Vdd.

measures drain current, Ids, at multiple values of Vds. This procedure is repeated for multiple Vgs values, and in this way creates a 2-dimensional lookup table for Ids, which forms the basis of the Type I low-conductance or "cold" device model abstraction. This "cold" abstraction should not be confused with temperature, it merely models the weakest possible Type I device over all switching histories.

Similarly, for the hot model, we initialize the device's gate, source and drain terminals to ground potential, and initialize the body terminal to the minimum voltage of this body potential range, block 55. Then, we generate IV curves, (block 57) via a transient circuit simulation, which:

quickly raises gate voltage to a value Vgs.

ramps drain voltage, Vds, from ground to supply voltage, Vdd.

measures drain current, Ids, at multiple values of Vds.

This procedure is repeated for multiple Vgs values, and in this way creates a 2-dimensional lookup table for Ids, which forms the basis of the Type I high-conductance or "hot" device model abstraction. This "hot" abstraction should not be confused with temperature, it merely models the strongest possible Type I device over all switching histories.

The above steps are repeated for a Type II device to obtain Type II "hot" and "cold" device model abstractions. In general, Type II devices have a larger body potential range since the source of a Type II device is not restricted to a single potential.

In estimating the delay through a series of gates composed of SOI deices, for early mode timing, one is concerned with the switching history which results in the shortest gate delays. Consider the circuit in FIG. 7 whereby the rising input A to rising output C delay is to be estimated. The first gate in the circuit is a 2-input NAND gate which is comprised of two Type I PFET devices, a Type I NFET device and a Type II NFET device. Circuit topology is analyzed to determine which devices have sources tied directly to a power rail. As the input A rises, the NFET (with gate connected to A) begins to conduct, pulling internal node B down to ground and the PFET (with gate connected to A) begins to turn off. Thus NFET and PFET conduct simultaneously for a brief period as input A switches from ground to Vdd; and this generates a cross-over current which 'subtracts' from the current charging the internal node B. Hence the shortest gate delay is obtained when NFET is strongest and PFET is weakest. The delay estimator invokes IV values for the Type II "hot" model for the NFET and Type II "cold" model IV values for PFET.

Figure 7:
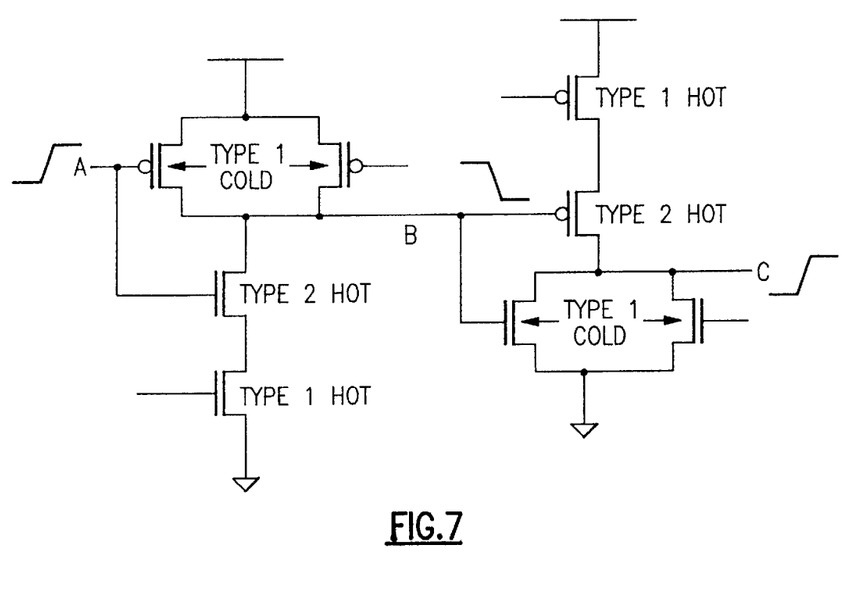
FIG. 7 is a schematic circuit diagram of coupled SOI devices.

The second gate in the circuit is a 2-input NOR gate which is comprised of two Type I NFET devices, a Type I PFET device and a Type II PFET device. As internal node B falls, the PFET (with gate connected to B) begins to conduct, pulling output C up to Vdd and the NFET (with gate connected to B) begins to turn off. Thus NFET and PFET conduct simultaneously for a brief period, as node B switches; this generates a cross-over current which 'subtracts' from the current discharging output C. Hence the shortest gate delay is obtained when PFET is strongest and NFET is weakest. The delay estimator invokes IV values for the Type II "hot" model for PFET and Type I "cold" model IV values for NFET.

For late mode timing one is concerned with the switching history which results in the longest gate delays. Consider the circuit in FIG. 8 whereby the rising input A to rising output C delay is to be estimated. The first gate in the circuit is a 2-input NAND gate which is comprised of two Type I PFET devices, a Type I NFET device, and a Type II NFET device. As the input A rises, the NFET (with gate connected to A) begins to conduct, pulling internal node B down to ground, and the PFET (with gate connected to A) begins to turn off. Thus, NFET and PFET conduct simultaneously for a brief period, as input A switches from ground to Vdd; and this generates a cross-over current which "subtracts" from the current charging the internal node B. Hence, the longest gate delay is obtained when the NFET is weakest and the PFET is strongest. The delay estimator invokes the Type II "cold" model IV characteristics for the NFET, and Type 1 "hot" model IV characteristics for the PFET.

Figure 8:
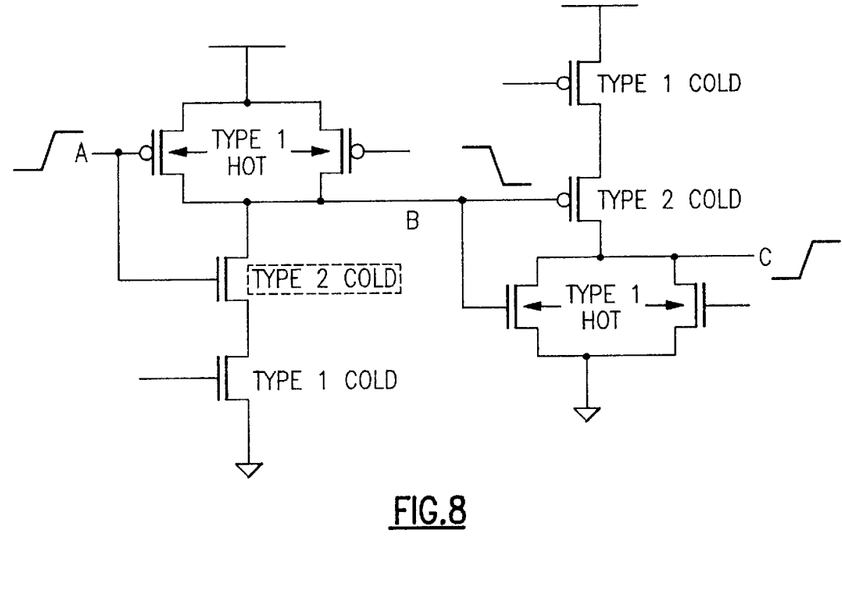
FIG. 8 is a schematic circuit diagram of coupled SOI devices.

The second gate in this circuit is a 2-input NOR gate which is comprised of two Type INFET devices, a Type I PFET device, and a Type II PFET device. As internal node B falls, the PFET (with gate connected to B) begins to conduct, pulling output C up to Vdd, and the NFET (with gate connected to B) begins to turn off. Thus, NFET and PFET conduct simultaneously for a brief period as node B switches; and this generates a cross-over current which 'subtracts' from the current discharging output C. Hence, the longest gate delay is obtained when the PFET is weakest and the NFET is strongest. The delay estimator invokes the Type II "cold" model IV characteristics for the PFET and Type I "hot" model IV characteristics for the NFET.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for generating multiple model abstractions of an SOI device, comprising:

initializing a source, a drain and a gate terminal of the SOI device to one of a ground potential and a $V_{dd}$ potential;

initializing a body terminal of the SOI device to one of a predetermined minimum and a predetermined maximum value of a predetermined voltage range of the body of the SOI device, and measuring the drain current during the application of various drain and gate terminal voltages to the SOI device.

2. A method for generating a cold model abstraction of an SOI NFET device, comprising:

initializing a source, a drain and a gate terminal of the SOI NFET device to ground potential;

initializing a body terminal of the SOI NFET device to a predetermined minimum value of a predetermined voltage range of the body of the SOI NFET device; and measuring the drain current during the application of various drain and gate terminal voltages to the SOI NFET device.

3. The method of claim 2, wherein said predetermined minimum value of said predetermined voltage range of the body of the SOI NFET device is determined by:

initializing the SOI NFET device to each of a plurality of non-conducting states;

after each initialization, switching the sate voltage of the SOI NFET device at an input slew rate representative of actual operation of the SOI NFET device, and switching the drain voltage of the SOI NFET device after a delay at an output slew rate representative of actual operation of the SOI NFET device so as to render the SOI NFET device in a different non-conducting state;

switching said SOI NFET device back to the original initialization voltage of each of said plurality of non-conducting states;

obtaining a plurality of steady-state body potential solutions; and identifying a minimum value of said steady-state body potential solutions.

4. A method for generating a hot model abstraction of an SOI NFET device, comprising:

initializing a source, a drain and a gate terminal of the SOI NFET to ground potential;

initializing a body terminal of the SOI NFET device to a predetermined maximum value of a predetermined voltage range of the body of the SOI NFET device; and measuring the drain current during the application of various drain and gate terminal voltages to the SOI NFET device.

5. The method of claim 4, wherein said predetermined maximum value of said predetermined voltage range of the body of the SOI NFET device is determined by:

initializing the SOI NFET device to each of a plurality of non-conducting states;

after each initialization, switching the gate voltage of the SOI NFET device at an input slew rate representative of actual operation of the SOI NFET device, and switching the drain voltage of the SOI NFET device alter a delay at an output slew rate representative of actual operation of the SOI NFET device so as to render the SOI NFET device in a different non-conducting state;

switching said SOI NFET device back to the original initialization voltage of each of said plurality of non-conducting states;

obtaining a plurality of steady-state body potential solutions; and identifying a maximum value of said steady-state body potential solutions.

6. A method for generating a cold model abstraction of an SOI PFET device, comprising:

initializing a source, a drain and a gate terminal of the SOI PFET device to a $V_{dd}$ potential;

initializing a body terminal of the SOI PFET device to a predetermined maximum value of a predetermined voltage range of the body of the SOI PFET device; and measuring the drain current during the application of various drain and gate terminal voltages to the SOI PFET device.

7. The method of claim 6, wherein said predetermined maximum value of said predetermined voltage range of the body of the SOI PFET device is determined by:

initializing the SOI PFET device to each of a plurality of non-conducting states;

after each initialization, switching the gate voltage of the SOI PFET device at an input slew rate representative of actual operation of the SOI PFET device, and switching the drain voltage of the SOI PFET device after a delay at an output slew rate representative of actual operation of the SOI PFET device so as to render the SOI PFET device in a different non-conducting state;

switching said SOI PFET device back to the original initialization voltage of each of said plurality of non-conducting states;

obtaining a plurality of steady-state body potential solutions; and identifying a maximum value of said steady-state body potential solutions.

8. A method for generating a hot model abstraction of an SOI PFET device, comprising:

initializing a source, a drain and a gate terminal of the SOI PFET device to a $V_{dd}$ potential;

initializing a body terminal of the SOI PFET device to a predetermined minimum value of a predetermined voltage range of the body of the SOI PFET device; and measuring the drain current during the application of various drain and gate terminal voltages to the SOI PFET device.

9. The method of claim 5, wherein said predetermined minimum value of said predetermined voltage range of the body of the SOI PFET device is determined by:

initializing the SOI PFET device to each of a plurality of non-conducting states;

after each initialization, switching the gate voltage of the SOI PFET device at an input slew rate representative of actual operation of the SOI PFET device, and switching the drain voltage of the SOI PFET device after a delay at an output slew rate representative of actual operation of the SOI PFET device so as to render the SOI PFET device in a different non-conducting state;

switching said SOI PFET device back to the original initialization voltage of each of said plurality of non-conducting states;

obtaining a plurality of steady-state body potential solutions; and identifying a minimum value of said steady-state body potential solutions.

* * * * *